United States Patent [19]

Iwabuchi et al.

[11] Patent Number: 5,293,299
[45] Date of Patent: * Mar. 8, 1994

[54] FUEL PUMP CONTROL CIRCUIT

[75] Inventors: Hideo Iwabuchi; Takeo Shimada, both of Saitama, Japan

[73] Assignee: Jidosha Kiki Co., Ltd., Japan

[*] Notice: The portion of the term of this patent subsequent to Dec. 29, 2009 has been disclaimed.

[21] Appl. No.: 836,767

[22] Filed: Feb. 18, 1992

[30] Foreign Application Priority Data

Feb. 20, 1991 [JP] Japan .................. 2-13570[U]

[51] Int. Cl.⁵ .............................. F02D 41/00
[52] U.S. Cl. ........................... 361/152; 361/154; 123/179.18; 123/497
[58] Field of Search ............... 361/152, 154, 139, 143, 361/153, 155, 156; 123/179.18, 179.1, 179.2, 497, 499, 493

[56] References Cited

U.S. PATENT DOCUMENTS

| | | | |
|---|---|---|---|
| 3,852,646 | 12/1974 | Mason | 361/154 |
| 4,845,420 | 7/1989 | Oshizawa et al. | 361/152 |
| 4,919,102 | 4/1990 | Iwabuchi | 123/499 |
| 5,175,663 | 12/1992 | Iwabuchi et al. | 361/152 |

*Primary Examiner*—Jeffrey A. Gaffin
*Attorney, Agent, or Firm*—Blakely, Sokoloff, Taylor & Zafman

[57] ABSTRACT

A fuel pump control circuit includes an SCR for controlling, after turning on of an ignition switch, power supply from a power source to a fuel pump circuit for driving a fuel pump (this SCR being turned on by a gate current supplied from the power source through a first conduction path), a timer circuit for shunting the gate current, which flows into the first conduction path, to a second conduction path when a predetermined time elapses after turning on of the ignition switch, and a current limiting resistor inserted in the first conduction path.

2 Claims, 1 Drawing Sheet

FUEL PUMP CONTROL CIRCUIT

BACKGROUND OF THE INVENTION

The present invention relates to a fuel pump control circuit and, more particularly, to an improvement in the invention of U.S. Ser. No. 07/598033 filed by the present applicants to the United States of America on Oct. 16, 1990.

The fuel pump control circuit of the above invention employs an SCR (thyristor: tradename). Upon turning on of an ignition switch, a gate current is supplied to the SCR via a first conduction path, thereby turning on the SCR. Consequently, a power source voltage is supplied to a fuel pump circuit for driving a fuel pump. When a predetermined time elapses in a timer circuit after the ON of the ignition switch, the gate current flowing into the first conduction path is shunted to a second conduction path. Since the gate current is decreased by this shunting and this decreases an anode current to be smaller than a holding current, the SCR is turned off to stop the supply of the power source voltage to the fuel pump circuit.

According to this fuel pump control circuit, therefore, a fuel is supplied to a carburetor for a predetermined time period immediately after turning on of the ignition switch. For this reason, even if a carburetor or piping of a vehicle is empty because the vehicle is a new one or it is left unused for a long time period or at a high temperature under a blazing sun, the carburetor or the piping is filled with a fuel upon start of an engine, and this improves the starting properties of the engine.

When, however, the above fuel pump control circuit is used in a high-temperature area or is mounted on a portion close to an engine of an actual car, the temperature of the SCR is sometimes increased abnormally due to heat derived from its location together with heat generated by its own circuit elements. In this case, a gate current value (to be referred to as a turn-on minimum current value hereinafter) by which the SCR can be turned on decreases to possibly prevent turning off of the SCR even when a predetermined time elapses in the timer circuit.

That is, the gate current flowing into the first conduction path abruptly decreases upon shunting into the second conduction path. Since, however, the turn-on minimum current value of the SCR decreases at an abnormally high temperature, the inflow gate current becomes larger than this turn-on minimum current value. For this reason, the SCR is not turned off even when the anode current is smaller than the holding current, and this makes it impossible to stop supply of a fuel to a carburetor.

Also, in the above fuel pump control circuit, if an abnormal voltage rise is caused by, e.g., a failure in a regulator, the gate current flowing into the SCR is increased to possibly prevent turning off of the SCR even when a predetermined time elapses in the timer circuit.

That is, when an abnormal voltage rise occurs, the gate current flowing into the first conduction path upon shunting into the second conduction path increases to be larger than the turn-on minimum current value. Therefore, by the same mechanism as in the case of an abnormally high temperature, the SCR is not turned off to fail to stop supply of a fuel to a carburetor.

Note that in order to solve the above problems, it may be possible to use an SCR having specifically selected temperature characteristics or to additionally provide a constant-current circuit. This, however, results in a high cost.

SUMMARY OF THE INVENTION

It is, therefore, a principal object of the present invention to provide a fuel pump control circuit capable of reliably turning off an SCR at a low cost.

In order to achieve the above object of the present invention, the present invention is a fuel pump control circuit having the above arrangement, in which a current limiting resistor with a proper value is inserted in the first conduction path.

According to an embodiment of the present invention, therefore, there is provided a fuel pump control circuit comprising an SCR for controlling, after turning on of an ignition switch, power supply from a power source to a fuel pump circuit for driving a fuel pump, the SCR being turned on by a gate current supplied from the power source through a first conduction path, a timer circuit for shunting the gate current, which flows into the first conduction path, to a second conduction path when a predetermined time elapses after turning on of the ignition switch, and a current limiting resistor inserted in the first conduction path.

DETAILED DESCRIPTION OF THE PREFERRED EMBODIMENT

Figure 1:
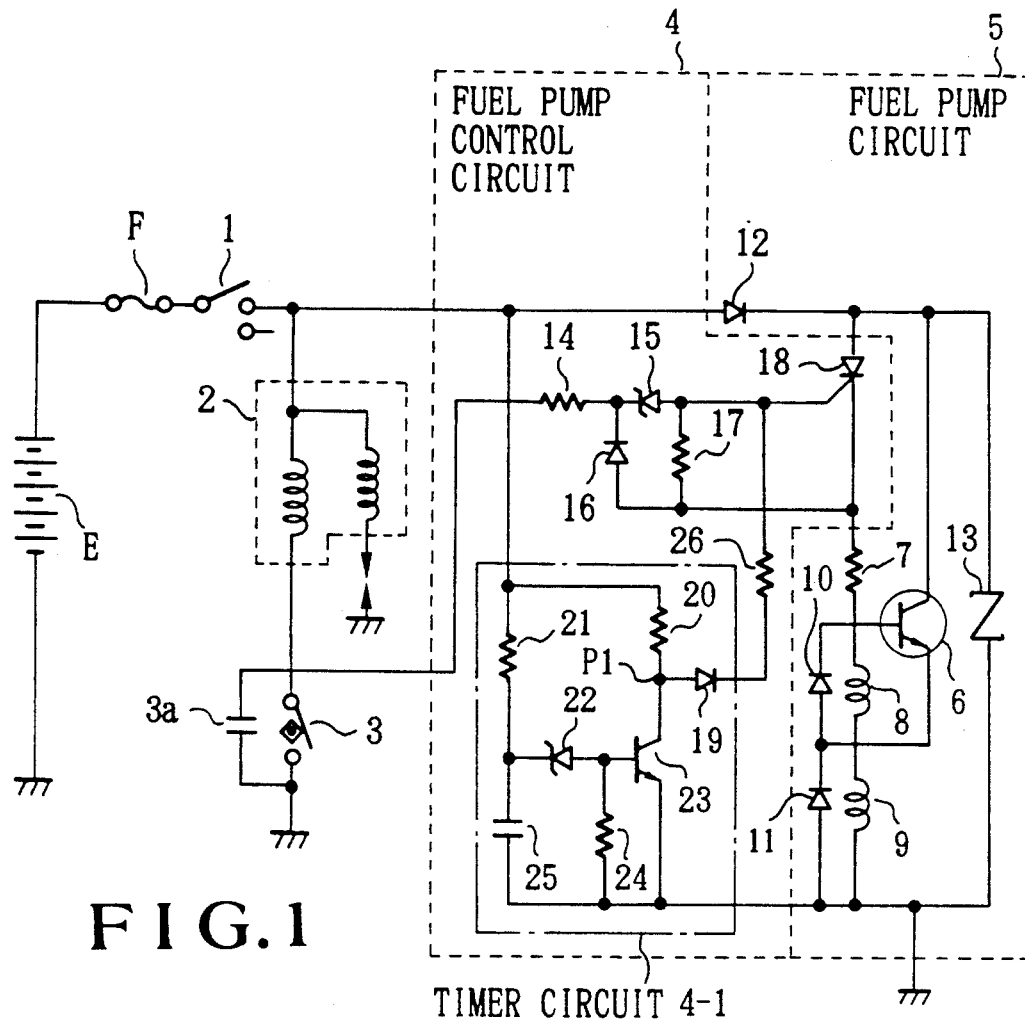
FIG. 1 is a circuit diagram showing a fuel pump driving system using an embodiment of a fuel pump control circuit according to the present invention.

FIG. 1 shows a fuel pump driving system using an embodiment of a fuel pump control circuit according to the present invention. Referring to FIG. 1, reference symbol E denotes a battery; and F, a fusing ring. Reference numeral 1 denotes an ignition switch; 2, an ignition coil; 3a, a capacitor; 3, a point breaker connected in parallel with the capacitor 3a; 4, a fuel pump control circuit; and 5, a fuel pump circuit constituted by a blocking oscillator.

The fuel pump control circuit 4 is constituted by resistors 14, 17, and 26, a Zener diode 15, a diode 16, an SCR 18, and a timer circuit 4-1. The timer circuit 4-1 is constituted by a diode 19, resistors 20, 21, and 24, a Zener diode 22, a transistor 23, and a capacitor 25. In this arrangement, a conduction path from a node P1 of the resistor 20 and the diode 19 to the gate of the SCR 18 corresponds to the first conduction path in the present invention; and a conduction path from the node P1 to a ground line via the transistor 23 corresponds to the second conduction path. The resistor 26 corresponds to the current limiting resistor of the present invention. In this embodiment, the resistor 26 is inserted between the cathode of the diode 19 and the gate of the SCR 18. The value of this current limiting resistor 26 is properly set at a value by which the SCR 18 can be reliably turned off against a decrease in the turn-on minimum current value of the SCR 18 due to an abnormally high temperature or against an increase in a gate current flowing into the first conduction path caused by an abnormal voltage rise.

The fuel pump circuit 5 is constituted by a transistor 6, a bias resistor 7 of the transistor 6, a signal coil 8, a main coil 9 for driving a fuel pump, diodes 10 to 12, and a varistor 13 serving as a surge absorber for protecting the transistor 6 by absorbing a surge. Electromagnetic close coupling between the signal coil 8 and the main coil 9 produces blocking oscillation. This blocking oscillation drives a fuel pump (not shown) to supply a fuel to a carburetor.

The characteristic operation of the above fuel pump driving system will be descried below.

When the ignition switch 1 is turned on, the timer circuit 4-1 connected to the output side of the switch starts its operation. Initially, an applied voltage to the capacitor 25 connected to the battery E via the ignition switch 1 is low, and the base potential of the transistor 23 having a base connected to a node of the resistor 21 and the capacitor 25 via the Zener diode 22 is at the ground potential. As a result, the transistor 23 is in OFF. For this reason, the gate current of the SCR is supplied to the gate of the SCR 18 through the resistor 20, the diode 19, and the current limiting resistor 26, i.e., through the first conduction path. Consequently, the SCR 18 is turned on to cause the fuel pump circuit 5 to operate.

When the charged voltage of the capacitor 25 rises at a time constant determined by the value of the resistor 21 and the value of the capacitor 25 and exceeds the Zener voltage of the Zener diode 22, the base current flows through the transistor 23 to turn it on. Upon turning on of the transistor 23, the gate current flowing into the first conduction path is shunted to the second conduction path. Since the anode current is decreased to be smaller than the holding current by a decrease in the gate current caused by this shunting, the SCR 18 is turned off.

That is, when a predetermined time elapses in the timer circuit 4-1 after turning on of the ignition switch 1, the SCR 18 is turned off to stop the operation of the fuel pump circuit 5. Therefore, even if a carburetor or piping is empty because fuel supply to the carburetor has been stopped, the carburetor or the piping is filled with a fuel upon start of an engine, thereby improving the starting properties of the engine.

Assume that the temperature of the SCR 18 is abnormally high. In this case, the turn-on minimum current value of the SCR 18 decreases. However, since the current limiting resistor 26 having a proper value is inserted in the first conduction path, the gate current which flows into the first conduction path upon shunting to the second conduction path becomes sufficiently small. Therefore, the gate current does not exceed the turn-on minimum current value even if the value decreases as described above. As a result, the SCR 18 is reliably turned off. That is, according to this embodiment, even when the SCR 18 is at an abnormally high temperature, the SCR 18 is reliably turned off to stop fuel supply to a carburetor when a predetermined time elapses in the timer circuit 4-1 after turning on of the ignition switch 1.

Next, suppose an abnormal voltage rise occurs due to, e.g., a failure in a regulator. In this case, the gate current flowing into the SCR 18 increases. However, since the current limiting resistor 26 with a proper value is inserted in the first conduction path, the gate current which flows into the first conduction path upon shunting into the second conduction path is suppressed to be sufficiently small. Therefore, the gate current does not exceed the turn-on minimum current value of the SCR 18, and this consequently makes it possible to reliably turn off the SCR 18. That is, according to this embodiment, even if an abnormal voltage rise occurs, the SCR 18 is reliably turned off to stop fuel supply to a carburetor when a predetermined time elapses in the timer circuit 4-1 after turning on of the ignition switch 1.

Figure 2:
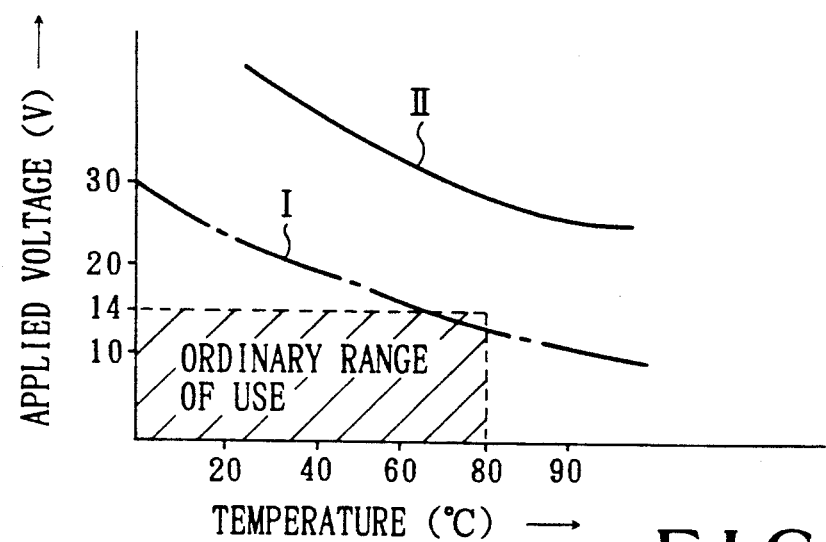
FIG. 2 is a graph showing temperature-applied voltage characteristics which indicate changes in limit levels obtained with and without a current limiting resistor.

FIG. 2 shows changes in limit levels obtained with and without the current limiting resistor 26. Referring to FIG. 2, the abscissa indicates the ambient temperature of the SCR 18, and the ordinate indicates the applied voltage. When the current limiting resistor 26 is not provided, the limit level has a characteristic curve I. That is, when the rated value of the applied voltage is 14 V, for example, the SCR 18 is no longer turned off after the ambient temperature exceeds about 70° C. When the current limiting resistor 26 is provided, however, the limit level has a characteristic curve II. This indicates that the SCR 18 is reliably turned off even if the ambient temperature rises abnormally. The characteristic curve II also reveals that the SCR 18 is reliably turned off even when the applied voltage rises abnormally.

According to the embodiment of the present invention as described above, the current limiting resistor 26 having a proper value is inserted in the first conduction path. Therefore, the SCR 18 is reliably turned off to stop fuel supply to a carburetor against a decrease in the turn-on minimum current value caused by an abnormally high temperature or against an increase in the gate current flowing into the first conduction path due to an abnormal voltage rise. As a result, the reliability of the system can be improved without deteriorating its safety.

In addition, according to this embodiment, the SCR 18 can be reliably turned off without selecting specific temperature characteristics of the SCR 18 nor additionally providing a constant-current circuit, thereby avoiding an increase in cost. In addition, insertion of the current limiting resistor 26 makes it possible to use a small-capacity diode as the diode 19, and this further reduces a cost.

As is apparent from the above description, according to the present invention, since a current limiting resistor with a proper value is inserted in the first conduction path, the gate current which flows into the first conduction path upon shunting to the second conduction path becomes sufficiently small. Therefore, the SCR is reliably turned off to stop fuel supply to a carburetor against a decrease in the turn-on minimum current value caused by an abnormally high temperature or against an increase in the gate current flowing into the first conduction path due to an abnormal voltage rise. As a result, the reliability of the system can be improved without deteriorating its safety.

In addition, since the SCR can be reliably turned off without selecting specific temperature characteristics of the SCR nor additionally providing a constant-current circuit, an increase in cost can be avoided.

When, for example, a diode is to be connected in the first conduction path, insertion of the current limiting resistor enables use of a small-capacity diode as that diode, and this further reduces a cost.

What is claimed is:

1. A fuel pump control circuit comprising:
an SCR for controlling, after turning on of an ignition switch, power supply from a power source to a fuel pump circuit for driving a fuel pump, said SCR being turned on by a gate current supplied from said power source through a first conduction path;

a timer circuit for shunting the gate current, which flows into said first conduction path, to a second conduction path when a predetermined time elapses after turning on of said ignition switch; and a current limiting resistor inserted in said first conduction path.

2. A circuit according to claim 1, wherein said timer circuit includes a transistor, one output electrode of said transistor being connected to a power source-side terminal of said first conduction path, an input electrode of said transistor being connected to means for setting a control time of said timer circuit, and the other output electrode of said transistor being set at a ground potential.

* * * * *